US009973209B2

(12) United States Patent
Kosuge et al.

(10) Patent No.: US 9,973,209 B2
(45) Date of Patent: May 15, 2018

(54) PROCESSOR AND DATA PROCESSING METHOD THEREOF

(71) Applicant: SAMSUNG ELECTRONICS CO., LTD., Suwon-si, Gyeonggi-do (KR)

(72) Inventors: Tetsuo Kosuge, Seoul (KR); Doo Hyun Kim, Seoul (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days. days.

(21) Appl. No.: 15/666,817

(22) Filed: Aug. 2, 2017

(65) Prior Publication Data

US 2018/0076827 A1 Mar. 15, 2018

(30) Foreign Application Priority Data

Sep. 12, 2016 (KR) .................. 10-2016-0117361

(51) Int. Cl.
*H03M 7/00* (2006.01)
*H03M 7/30* (2006.01)
*H03M 7/40* (2006.01)

(52) U.S. Cl.
CPC ....... *H03M 7/6011* (2013.01); *H03M 7/6005* (2013.01); *H03M 7/4006* (2013.01)

(58) Field of Classification Search
CPC ................ H03M 7/4006; H04N 7/50
USPC .......... 341/107; 375/240.01, 240.02, 240.12, 375/240.18
See application file for complete search history.

(56) References Cited

U.S. PATENT DOCUMENTS

| 8,604,951 | B2 | 12/2013 | Sze et al. | |
| 2012/0086587 | A1 | 4/2012 | Sze et al. | |
| 2013/0272373 | A1* | 10/2013 | Wong ..................... | H04N 19/00 375/240.01 |

* cited by examiner

*Primary Examiner* — Joseph Lauture
(74) *Attorney, Agent, or Firm* — Nixon & Vanderhye, P.C.

(57) ABSTRACT

A processor includes a first encoder configured to encode a regular bin block including at least one regular bin, a second encoder configured to encode a bypass bin block including at least one bypass bin, and a parameter calculating module comprising parameter calculating circuitry configured to determine context information for encoding the regular bin block and to transmit the context information to the first encoder. The first encoder and the second encoder may process the regular bin block and the bypass bin block simultaneously and in parallel during at least part of a specific processing cycle.

19 Claims, 8 Drawing Sheets

PROCESSOR AND DATA PROCESSING METHOD THEREOF

CROSS-REFERENCE TO RELATED APPLICATION

This application is based on and claims priority under 35 U.S.C. § 119 to a Korean patent application filed on Sep. 12, 2016 in the Korean Intellectual Property Office and assigned Serial number 10-2016-0117361, the disclosure of which is incorporated by reference herein in its entirety.

TECHNICAL FIELD

The present disclosure relates generally to a processor capable of processing data in parallel and a data processing method of the processor.

BACKGROUND

With the advent of the information era, various kinds of content such as video, an audio, a game, and a program are being produced and a technology for storing, transmitting, and playing the content are also being developed.

As the content becomes higher in quality, the size of the content increases. To this end, the storage capacity and transmission capacity of the content is also rapidly increasing. However, it is inefficient to directly store and transmit the content as it is. Accordingly, various kinds of compression techniques for compressing the content are being developed.

Generally, the compression performance of codec may be evaluated by the amount of loss of the content or the quality of the decrypted content, which is based on the compression rate of the content, and the codec may perform a plurality of coding procedures to improve the compression performance.

Various codecs may perform entropy coding using part of a plurality of coding procedures. The entropy coding may be a lossless compression scheme that is based on the probability of occurrence of a symbol and may include fixed length coding, variable length coding, Huffman coding, arithmetic coding, and the like.

In the case of adaptive binary arithmetic coding of the arithmetic coding, the probability that a symbol occurs continuously changes in the coding procedure because the symbols to be encoded depend on each other. The adaptive binary arithmetic coding has difficulty in parallel processing due to the dependency between symbols. Accordingly, a bottleneck may occur in the entire coding procedure.

SUMMARY

Example aspects of the present disclosure address at least the above-mentioned problems and/or disadvantages and to provide at least the advantages described below. Accordingly, an example aspect of the present disclosure is to provide a processor capable of processing data in parallel and a data processing method of the processor.

In accordance with an example aspect of the present disclosure, a processor includes a first encoder configured to encode a regular bin block including at least one regular bin, a second encoder configured to encode a bypass bin block including at least one bypass bin, and a parameter calculating module comprising parameter calculating circuitry configured to calculate context information for encoding the regular bin block and to transmit the context information to the first encoder. The first encoder and the second encoder process the regular bin block and the bypass bin block simultaneously and in parallel during at least part of a specific processing cycle.

In accordance with an example aspect of the present disclosure, a data processing method of a processor includes encoding a first regular bin block including at least one first regular bin during a first processing cycle, calculating start context information of a second regular bin block including at least one second regular bin during the first processing cycle, encoding the second regular bin block using the start context information of the second regular bin block during a second processing cycle, and encoding a first bypass bin block, which is interposed between the first regular bin block and the second regular bin block and which includes at least one bypass bin, during the second processing cycle.

In accordance with an example aspect of the present disclosure, a computer-readable recording medium has recorded thereon a program which when executed by a processor causes the processor to perform operations including encoding a first regular bin block including at least one first regular bin during a first processing cycle, calculating start context information of a second regular bin block including at least one second regular bin during the first processing cycle, encoding the second regular bin block using the start context information of the second regular bin block during a second processing cycle, and encoding a first bypass bin block, which is interposed between the first regular bin block and the second regular bin block and which includes at least one bypass bin, during the second processing cycle.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and attendant advantages of the present disclosure will be more apparent and readily appreciated from the following detailed description, taken in conjunction with the accompanying drawings, in which like reference numerals refer to like elements, and wherein.

Throughout the drawings, it should be noted that like reference numbers are used to depict the same or similar elements, features, and structures.

DETAILED DESCRIPTION

Figure 1:
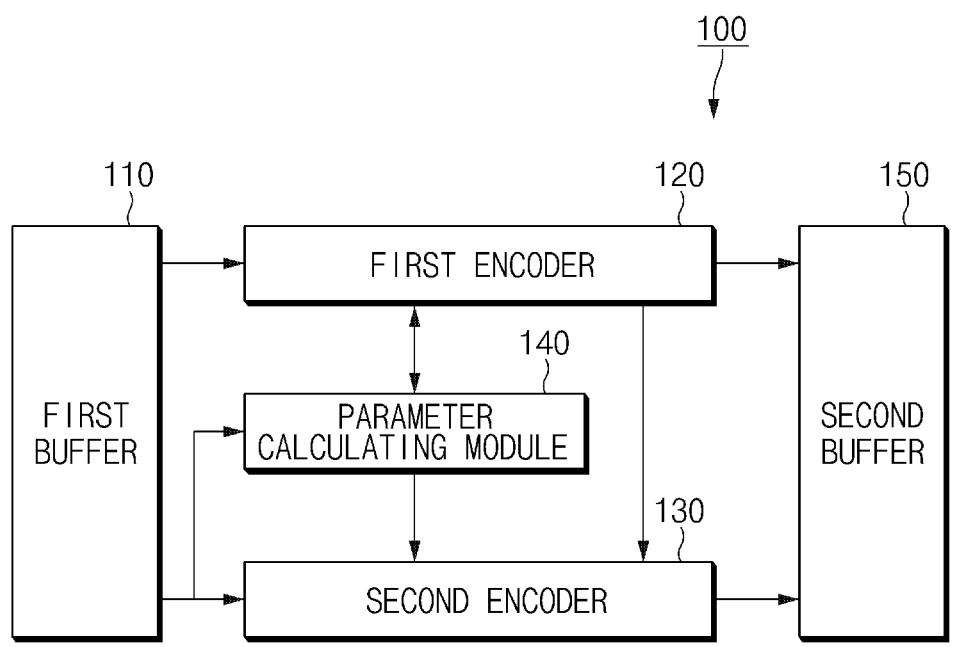
FIG. 1 is a block diagram illustrating an example configuration of an arithmetic encoder, according to various example embodiments of the present disclosure.

Hereinafter, various example embodiments of the present disclosure may be described with reference to accompanying drawings. Accordingly, those of ordinary skill in the art will recognize that modifications, equivalents, and/or alternatives of the various embodiments described herein can be variously made without departing from the scope and spirit of the present disclosure. With regard to description of drawings, similar elements may be marked by similar reference numerals.

Terms used in this disclosure are used to describe specified embodiments and are not intended to limit the scope of the present disclosure. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of this disclosure. In some cases, even if terms are terms which are defined in this disclosure, they may not be interpreted to exclude embodiments of this disclosure.

FIG. 1 is a block diagram illustrating an example configuration of an arithmetic encoder, according to various example embodiments of the present disclosure.

An arithmetic encoder (or a processor) 100 illustrated in FIG. 1 may be applied to various types of codecs performing adaptive binary arithmetic coding in an entropy coding manner. For example, the arithmetic encoder 100 may be applied to codec that uses context-based adaptive binary arithmetic coding (CABAC) such as high efficiency video codec (HEVC). However, the applying of the arithmetic encoder 100 is not limited to the HEVC.

Referring to FIG. 1, the arithmetic encoder 100 may include a first buffer 110, a first encoder 120, a second encoder 130, a parameter calculating (determining) module (e.g., including parameter determining circuitry and/or program elements) 140, and a second buffer 150. According to an example embodiment, the arithmetic encoder 100 may be implemented using various circuitry and as, for example, a system on chip (SoC) including at least one processor and a memory (e.g., the first buffer 110 and the second buffer 150). The elements of the arithmetic encoder 100 illustrated in FIG. 1 may be a separate hardware module or may be a software module implemented by at least one processor. For example, the function of each of the elements included in the arithmetic encoder 100 may be performed by one processor or may be performed by each separate processor. The first buffer 110 and the second buffer 150 are illustrated in FIG. 1 as being included in the arithmetic encoder 100. However, at least part of the first buffer 110 and the second buffer 150 may be an external memory that is disposed outside the arithmetic encoder 100 and is electrically connected with the arithmetic encoder 100.

According to an example embodiment, the first buffer 110 may store a bin string. Before a video frame is input to the arithmetic encoder 100, a plurality of coding processes such as intra prediction, motion estimation, motion compensation, domain conversion, or quantization may be performed on the video frame. A plurality of syntax elements may be generated from the video frame depending on the above-described coding process, and the syntax elements may be converted into a bin string, which is an array of bins consisting of only '0' and '1' through a binarization process. The bin is the basic unit of coding. The bin may include a regular bin in which the probability of each symbol included in a bin is predicted using context information, and a bypass bin in which the probability of occurrence of the symbol included in the bin is ½.

According to an example embodiment, the bin string may include a regular bin block including at least one regular bin and a bypass bin block including at least one bypass bin.

Figure 2:
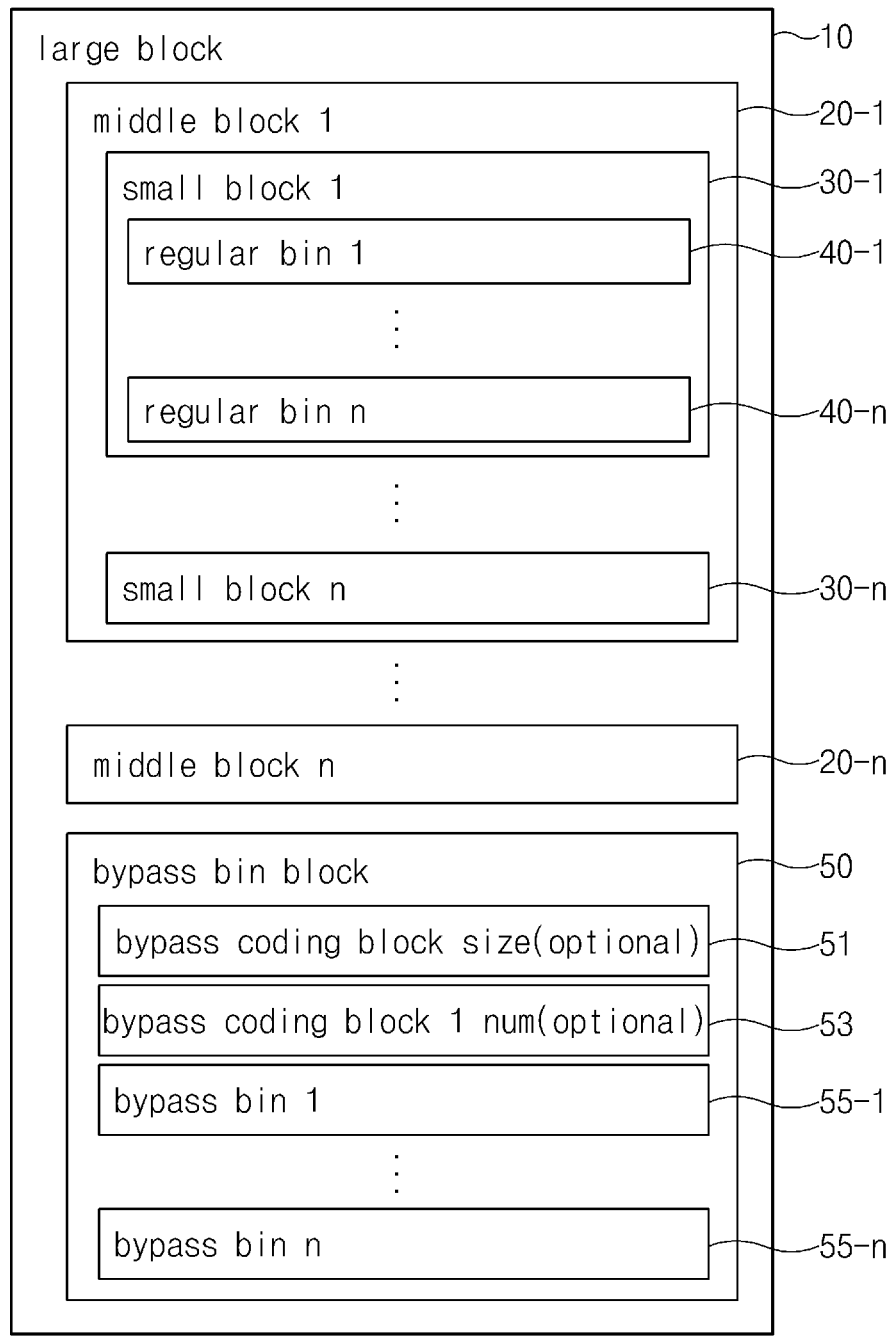
FIG. 2 is a diagram illustrating example data syntax, according to various example embodiments of the present disclosure.

FIG. 2 is a diagram illustrating example data syntax, according to various example embodiments of the present disclosure.

Referring to FIG. 2, a large block 10 may include one or more middle blocks 20-1 to 20-*n*. Each of the middle blocks 20-1 to 20-*n* may include one or more small blocks 30-1 to 30-*n*. Each of the small blocks 30-1 to 30-*n* may include one or more regular bins 40-1 to 40-*n*. The one or more middle blocks 20-1 to 20-*n* may be a set of (e.g., a regular bin block) of the regular bins included in the large block 10.

According to an example embodiment, the large block 10 may include a bypass bin block 50. The bypass bin block 50 may include one or more bypass bins 55-1 to 55-*n*. The bypass bin block 50 may be a set of the bypass bins included in the large block 10. According to an embodiment, the bypass bin block 50 may include size information 51 of a bypass coding block that is the encoding result of the bypass bin block. For example, the size information 51 of the bypass coding block may be information about the number of all symbols (e.g., '0' and '1') included in the bypass coding block 50. According to an embodiment, the bypass bin block 50 may include at least one information 53 about the number of symbols included in the bypass coding block. For example, the at least one information 53 about the number of symbols may include at least one of information about the number of symbols '0s' and information about the number of symbols '1s'. According to an embodiment, the size information 51 of the bypass coding block and the at least one information 53 about the number of symbols may be inserted into a starting location of the bypass bin block 50. According to an embodiment, the size information 51 of the bypass coding block and the at least one information 53 about the number of symbols may be omitted.

According to an example embodiment, the large block 10 may include one regular bin block and the one bypass bin block 50. For example, after all regular bins included in the large block 10 are continuously disposed in the large block 10, all the bypass bins included in the large block 10 may be disposed.

According to an example embodiment, the bin string may be a set of the large block 10 illustrated in FIG. 2. For example, a plurality of large blocks 10 may be continuously disposed in the bin string. For example, a regular bin block and a bypass bin block included in the plurality of large blocks 10 may be alternately disposed in the bin string.

Before a video frame is input to the arithmetic encoder 100, the video frame may be processed in units of a block. For example, one video frame may be divided into at least one slice, and one slice may be divided into at least one slice segment. One slice segment may be divided into at least one coding tree unit (CTU), and one CTU may be divided into at least one coding unit (CU). One CU may be divided into at least one prediction unit (PU) or transfer unit (TU). According to an embodiment, the large block 10 may correspond to a CTU of processing units of the video frame. For example, the regular bin block may be a set of regular bins included in one CTU, and the bypass bin block 50 may be a set of bypass bins included in one CTU. According to an embodiment, the large block 10 may correspond to the slice (or the slice segment) of processing units of the video frame. For example, the regular bin block may be a set of regular bins included in one slice (or one slice segment), and the bypass bin block 50 may be a set of bypass bins included in one slice (or one slice segment).

According to an example embodiment, the bin string stored in the first buffer 110 may be input to the first encoder 120, the second encoder 130, and the parameter calculating module 140. For example, the regular bin block included in the bin string may be input to the first encoder 120, and the bypass bin block included in the bin string may be input to the second encoder 130 and the parameter calculating module 140.

According to an example embodiment, the first encoder 120 may encode the regular bin block received from the first buffer 110. According to an embodiment, the first encoder 120 may perform regular encoding on the regular bin block. For example, the regular encoding may be adaptive binary arithmetic coding, which performs encoding depending on the probabilities of occurrence of symbols (e.g., '0' and '1') included in the regular bin, using context information. The context information may be information about the probabilities of occurrence of symbols, and may include, for example, syntax information of a bin, bin index information that is a location of a bin in the bin string, probability information of a bin included in a block adjacent to a block including a bin, or the like. According to an embodiment, if the regular encoding is started, the first encoder 120 may perform context modeling for estimating probability information of the bin using the context information. According to an embodiment, the first encoder 120 may perform regular encoding on the input bin using the probability information of the bin. According to an embodiment, the first encoder 120 may continuously update context information in an encoding process of the regular bin block.

According to an example embodiment, after encoding the regular bin block, the first encoder 120 may store the regular coding block, which is the encoding result of the regular bin block, in the second buffer 150. For example, the regular coding block may include at least one encoded regular bin. According to an embodiment, if the encoding of the regular bin block is completed, the first encoder 120 may transmit storage ending location information of the regular coding block (or storage starting location information of the bypass coding block) to the second encoder 130. For example, if the encoding of a first regular bin block is completed, the first encoder 120 may transmit storage ending location information of a first regular coding block (or storage starting location information of a first bypass coding block) being the encoding result of the first regular bin block to the second encoder 130.

According to an example embodiment, the second encoder 130 may encode the bypass bin block received from the first buffer 110. According to an embodiment, the first encoder 120 may perform bypass encoding on the bypass bin block. For example, the bypass encoding may be a simple coding method that encodes the bypass bin in which the probabilities of occurrence of symbols (e.g., '0' and '1') are the same as each other.

According to an example embodiment, after encoding the bypass bin block, the second encoder 130 may store the bypass coding block, which is the encoding result of the bypass bin block, in the second buffer 150. For example, the bypass coding block may include at least one encoded bypass bin. According to an embodiment, the second encoder 130 may store the bypass coding block in the second buffer 150 based on storage ending location information of the regular coding block (or storage starting location information of the bypass coding block) received from the first encoder 120. For example, after setting the storage ending location of the first regular coding block received from the first encoder 120 to the starting location, the second encoder 130 may store the first bypass coding block.

According to an example embodiment, the first encoder 120 and the second encoder 130 may be disposed in the arithmetic encoder 100 in parallel. According to an embodiment, the first encoder 120 and the second encoder 130 may encode one regular bin block and one bypass bin block during a specified processing cycle, respectively. For example, the first encoder 120 may encode the first regular bin block during a first processing cycle and may encode a second regular bin block during a second processing cycle. The second encoder 130 may encode the first bypass bin block interposed between the first regular bin block and the second regular bin block during the second processing cycle. That is, the first bypass bin block may be encoded during the next cycle of a cycle in which the first regular bin block is encoded.

According to an example embodiment, the first encoder 120 and the second encoder 130 may operate at the same time during at least part of a time period. For example, a time period in which the first encoder 120 encodes the second regular bin block during the second processing cycle may at least partially overlap a time period in which the second encoder 130 encodes the first bypass bin block during the second processing cycle.

According to an example embodiment, the parameter calculating module 140 may calculate context information of the bypass bin block using the bypass bin block received from the first buffer 110. Unlike the regular encoding, the bypass encoding does not need a context modeling process. However, symbols included in the bypass bin may affect the context information of symbols included in the regular bin due to the feature of adaptive binary arithmetic coding. Accordingly, as well as the context information of the first regular bin block, the context information of the first bypass bin block may be needed such that the first encoder 120 encodes the second regular bin block.

According to an example embodiment, before the bypass bin block is encoded, the parameter calculating module 140 may calculate (determine) the parameter of the bypass bin block. For example, the parameter may include at least one of the context information of the bypass bin block, the size of the bypass coding block, or at least one information about the number of symbols included in the bypass coding block. For example, the parameter calculating module 140 may calculate (determine) the context information of the first bypass bin block during the first processing cycle that is before the second encoder 130 encodes the first bypass bin block. As another example, the parameter calculating module 140 may calculate the size of the first bypass coding block being the encoding result of the first bypass bin block during the first processing cycle that is before the second encoder 130 encodes the first bypass bin block.

According to an embodiment, if the encoding of the regular bin block is completed, the first encoder 120 may transmit final context information of the regular bin block to the parameter calculating module 140. According to an embodiment, the parameter calculating module 140 may calculate context information for encoding the next regular bin block using the final context information of the regular bin block received from the first encoder 120 and the context information of the bypass bin block. For example, the parameter calculating module 140 may calculate start context information of the second regular bin block using the final context information of the first regular bin block that is received from the first encoder 120 and the context information of the first bypass bin block. According to an embodiment, the parameter calculating module 140 may transmit the start context information of the second regular bin block to the first encoder 120. According to an embodiment, the first encoder 120 may encode the second regular bin block using the start context information of the second regular bin block during the second processing cycle.

According to an embodiment, the parameter calculating module 140 may transmit the context information of the bypass bin block to the first encoder 120. According to an embodiment, the first encoder 120 may calculate context information for encoding the regular bin block using the context information of the bypass bin block received from the parameter calculating module 140. For example, the first encoder 120 may calculate the start context information of the second regular bin block using the final context information of the first regular bin block and the context information of the first bypass bin block received from the parameter calculating module 140. According to an embodiment, the first encoder 120 may encode the second regular bin block using the start context information of the second regular bin block during the second processing cycle.

According to an embodiment, if the encoding of the regular bin block is completed, the first encoder 120 may transmit storage ending location information of the regular coding block to the parameter calculating module 140. According to an embodiment, the parameter calculating module 140 may calculate storage ending location information of the bypass coding block (or storage starting location information of the next regular coding block) using the storage ending location information of the regular coding block received from the first encoder 120 and size information of the bypass coding block. For example, the parameter calculating module 140 may calculate the storage ending location information of the first bypass coding block (or the storage starting location information of the second regular coding block) using the storage ending location information of the first regular coding block received from the first encoder 120 and the size information of the first bypass coding block. According to an embodiment, the parameter calculating module 140 may transmit the storage ending location information of the first bypass coding block to the first encoder 120. According to an embodiment, the first encoder 120 may store the second regular coding block being the encoding result of the second regular bin block in the second buffer 150 based on the storage ending location information of the first bypass coding block during the second processing cycle. For example, after setting the storage ending location of the first bypass coding block to the starting location, the first encoder 120 may store the second regular coding block.

According to an embodiment, the parameter calculating module 140 may transmit the size information of the bypass coding block to the first encoder 120. According to an embodiment, the first encoder 120 may calculate the storage ending location information of the bypass coding block (or the storage starting location information of the next regular coding block) using the size information of the bypass coding block received from the parameter calculating module 140. For example, the first encoder 120 may calculate the storage ending location information of the first bypass coding block (or the storage starting location information of the second regular coding block) using the storage ending location information of the first regular coding block and the size information of the first bypass coding block received from the parameter calculating module 140. According to an embodiment, the first encoder 120 may store the second regular coding block being the encoding result of the second regular bin block in the second buffer 150 based on the storage ending location information of the first bypass coding block during the second processing cycle. For example, after setting the storage ending location of the first bypass coding block to the starting location, the first encoder 120 may store the second bypass coding block.

According to an embodiment, the parameter calculating module 140 may insert additional information for calculating a parameter of a decoder (e.g., the arithmetic decoder 200 of FIG. 4) into the bypass bin block before the bypass bin block is encoded. For example, the additional information may include the size information of the bypass coding block and at least one information about the number of symbols included in the bypass coding block. For example, the parameter calculating module 140 may insert the additional information into the starting location of a bypass bin block. According to an embodiment, the second encoder 130 may encode the bypass bin block in which the additional information is included.

According to an embodiment, the parameter calculating module 140 may verify the number of bypass bins included in the bypass bin block. According to an embodiment, the first encoder 120 may transmit information about the number of regular bins included in the regular bin block to the parameter calculating module 140. According to an embodiment, the parameter calculating module 140 may determine whether the additional information is inserted, based on the number of regular bins included in the regular bin block and the number of bypass bins included in the bypass bin block. For example, if the sum of the number of regular bins included in the first regular bin block and the number of bypass bins included in the first bypass bin block is greater than a specified value, the parameter calculating module 140 may insert the additional information of the first bypass bin block into the first bypass bin block. In the case where each of the number of regular bins included in the regular bin block and the number of bypass bins included in the bypass bin block is greater than a specified value, the parameter calculating module 140 may determine that the decoder (e.g., the arithmetic decoder 200 of FIG. 4) does not complete the decoding of the regular coding block and the parameter calculation of the bypass coding block during a specified processing cycle, and may insert the additional information, which is needed to calculate the parameter of the bypass coding block, into the bypass bin block.

According to an embodiment, the second buffer 150 may store a bit stream being the encoding result of the bin string. For example, the second buffer 150 may be a bit stream buffer. According to an embodiment, the bit stream may include a regular coding block including at least one encoded regular bin and a bypass coding block including at least one encoded bypass bin. According to an embodiment, the regular coding block and the bypass coding block included in the bit stream may be disposed in the order corresponding to the regular bin block and the bypass bin block included in the bin string. For example, if the bin string disposed in the order of the first regular bin block, the first bypass bin block, the second regular bin block, and the second bypass bin block is input to the arithmetic encoder 100, the bit stream disposed in the order of the first regular coding block, the first bypass coding block, the second regular coding block, and the second bypass coding block may be output.

Figure 3:
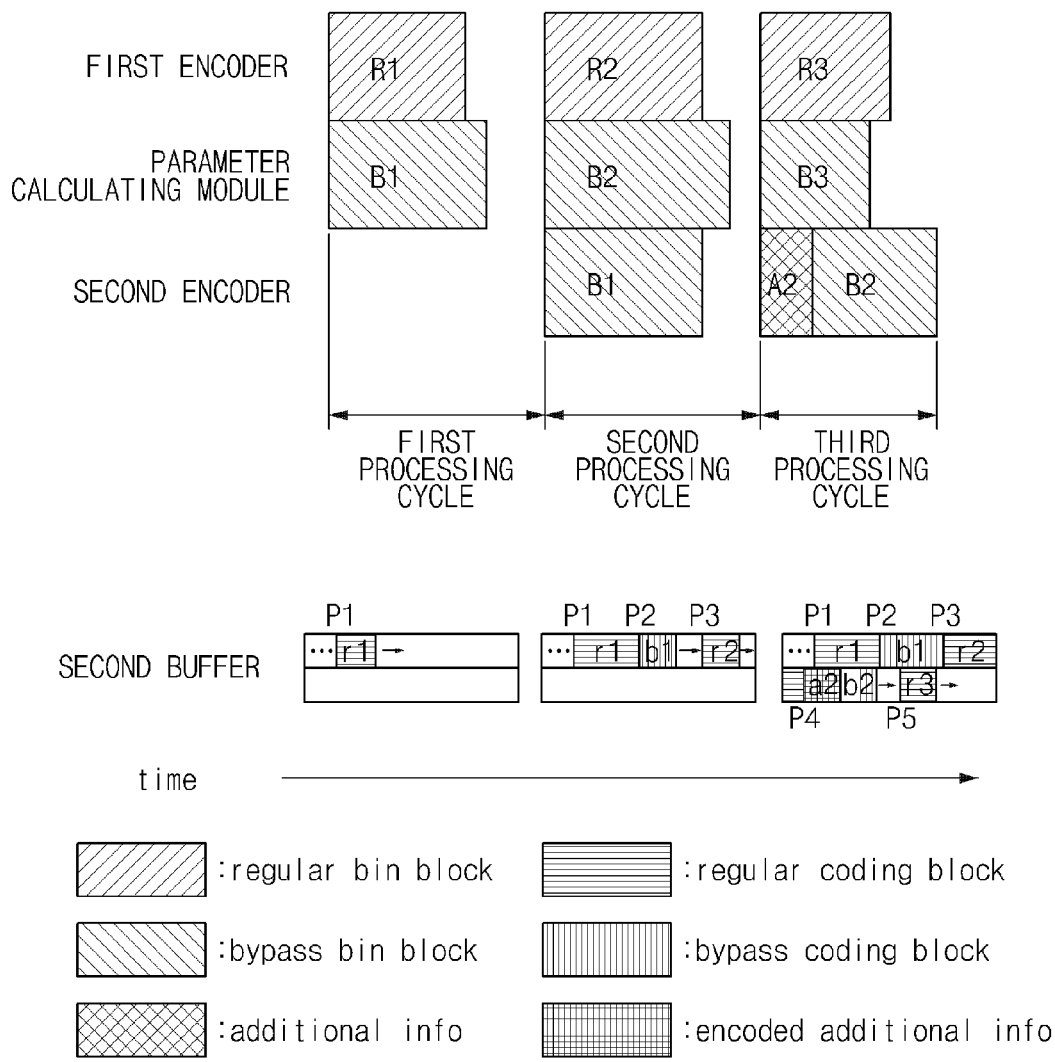
FIG. 3 is a diagram illustrating an example encoding process as time goes on, according to various example embodiments of the present disclosure.

FIG. 3 is a diagram illustrating an example encoding process as time goes on, according to various example embodiments of the present disclosure.

According to an embodiment, the first encoder 120 may encode a first regular bin block R1 during a first processing cycle. For example, the first encoder 120 may encode the first regular bin block R1 using start context information of the first regular bin block R1. According to an embodiment, the first encoder 120 may store a first regular coding block r1 being the encoding result of the first regular bin block R1 in the second buffer 150. For example, the first encoder 120 may store the first regular coding block r1 from a first location P1 of the second buffer 150.

According to an embodiment, the parameter calculating module 140 may calculate a parameter of a first bypass bin block B1 during the first processing cycle. For example, the parameter calculating module 140 may calculate the context information of the first bypass bin block B1. As another example, the parameter calculating module 140 may calculate the size of a first bypass coding block b1 being the encoding result of the first bypass bin block B1.

According to an embodiment, the first encoder 120 or the parameter calculating module 140 may calculate the start context information of a second regular bin block R2 using the final context information of the first regular bin block R1 and the context information of the first bypass bin block B1 during the first processing cycle. According to an embodiment, the first encoder 120 or the parameter calculating module 140 may calculate a third location P3 being a storage starting location of a second regular coding block r2 using a storage ending location P2 of the first regular coding block r1 and the size information of the first bypass coding block b1 during the first processing cycle.

According to an embodiment, the first encoder 120 may encode the second regular bin block R2 during a second processing cycle. For example, the first encoder 120 may encode the second regular bin block R2 using start context information of the second regular bin block R2. According to an embodiment, the first encoder 120 may store the second regular coding block r2 being the encoding result of the second regular bin block R2 in the second buffer 150. For example, the first encoder 120 may store the second regular coding block r2 from the third location P3 of the second buffer 150.

According to an embodiment, the parameter calculating module 140 may calculate a parameter of a second bypass bin block B2 during the second processing cycle. For example, the parameter calculating module 140 may calculate the context information of the second bypass bin block B2. As another example, the parameter calculating module 140 may calculate the size of a second bypass coding block b2 being the encoding result of the second bypass bin block B2.

According to an embodiment, the first encoder 120 or the parameter calculating module 140 may calculate the start context information of a third regular bin block R3 using the final context information of the second regular bin block R2 and the context information of the second bypass bin block B2 during the second processing cycle. According to an embodiment, the number of regular bins included in the second regular bin block R2 and the number of bypass bins included in the second bypass bin block B2 may be greater than a specified value. As such, the parameter calculating module 140 may insert additional information A2 of the second bypass bin block B2 into the second bypass bin block B2. For example, the additional information may include the size information of the second bypass coding block b2 and at least one information about the number of symbols included in the second bypass coding block b2. The parameter calculating module 140 may update the size information of the second bypass coding block b2 depending on the insertion of the additional information A2. According to an embodiment, the first encoder 120 or the parameter calculating module 140 may calculate a fifth location P5 being a storage starting location of a third regular coding block r3 using a storage ending location P4 of the second regular coding block r2 and the size information of the second bypass coding block b2 during the second processing cycle.

According to an embodiment, the second encoder 130 may encode the first bypass bin block B1 during the second processing cycle. According to an embodiment, the second encoder 130 may store the first bypass coding block b1 being the encoding result of the first bypass bin block B1 in the second buffer 150. For example, the second encoder 130 may store the first bypass coding block b1 from the second location P2 of the second buffer 150 being the storage ending location of the first regular coding block r1.

According to an embodiment, the first encoder 120 may encode the third regular bin block R3 during a third processing cycle. For example, the first encoder 120 may encode the third regular bin block R3 using start context information of the third regular bin block R3. According to an embodiment, the first encoder 120 may store the third regular coding block r3 being the encoding result of the third regular bin block R3 in the second buffer 150. For example, the first encoder 120 may store the third regular coding block r3 from the fifth location P5 of the second buffer 150.

According to an embodiment, the parameter calculating module 140 may calculate a parameter of a third bypass bin block B3 during the third processing cycle. For example, the parameter calculating module 140 may calculate the context information of the third bypass bin block B3. As another example, the parameter calculating module 140 may calculate the size of a third bypass coding block b3 being the encoding result of the third bypass bin block B3.

According to an embodiment, the first encoder 120 or the parameter calculating module 140 may calculate the start context information of a fourth regular bin block (not illustrated) using the final context information of the third regular bin block R3 and the context information of the third bypass bin block B3 during the third processing cycle. According to an embodiment, the first encoder 120 or the parameter calculating module 140 may calculate the storage starting location (not illustrated) of the fourth regular coding block (not illustrated) using the storage ending location (not illustrated) of the third regular coding block r3 and the size information of the third bypass coding block b3 during the third processing cycle.

According to an embodiment, the second encoder 130 may encode the second bypass bin block B2 during the third processing cycle. For example, the second bypass bin block B2 may include the additional information A2 of the second bypass bin block B2. According to an embodiment, the second encoder 130 may store the second bypass coding block b2 being the encoding result of the second bypass bin block B2 in the second buffer 150. For example, the second encoder 130 may store the second bypass coding block b2 from the fourth location P4 of the second buffer 150 being the storage ending location of the second regular coding block r2. For example, the second bypass coding block b2 may include encoded additional information a2.

According to various embodiments of the present disclosure, the parameter of the bypass bin block may be calculated before the bypass bin block is encoded, and thus the encoding of the regular bin block and the bypass bin block may be simultaneously processed in parallel. As such, even a block in which there is a lot of bins may be processed within a specified processing cycle, and the bottleneck in an entropy coding step may be reduced.

Figure 4:
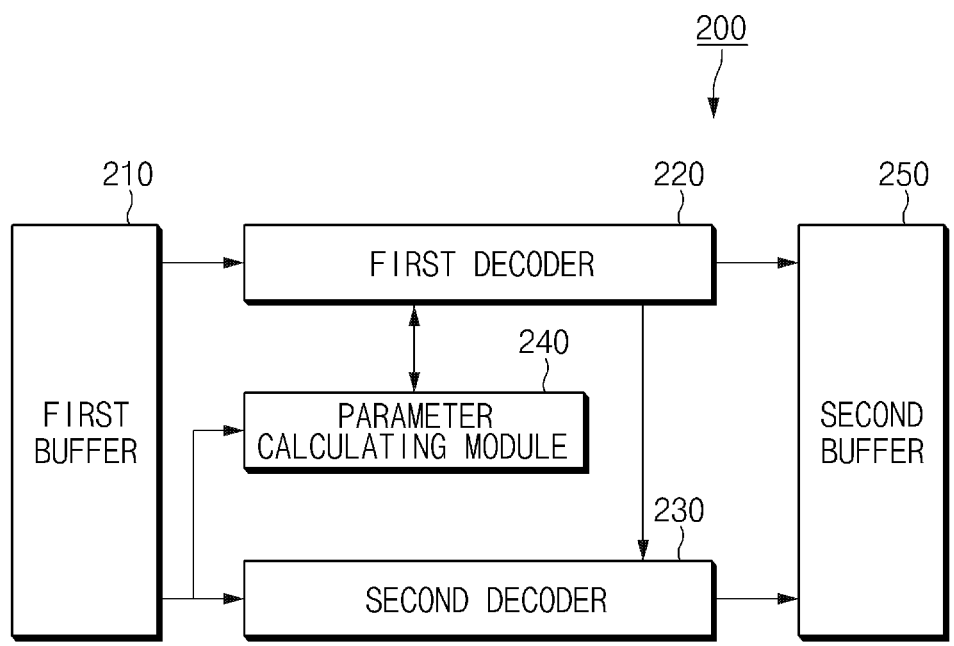
FIG. 4 is a block diagram illustrating an example configuration of an arithmetic decoder, according to various example embodiments of the present disclosure.

FIG. 4 is a block diagram illustrating an example configuration of an arithmetic decoder, according to various example embodiments of the present disclosure.

An arithmetic decoder (or a processor) 200 illustrated in FIG. 4 may be applied to various types of codecs performing adaptive binary arithmetic coding in an entropy coding manner. For example, the arithmetic decoder 200 may be applied to codec that uses context-based adaptive binary arithmetic coding (CABAC) such as high efficiency video codec (HEVC). However, the applying of the arithmetic decoder 200 is not limited to the HEVC.

Referring to FIG. 4, the arithmetic decoder 200 may include a first buffer 210, a first decoder 220, a second decoder 230, a parameter calculating module (e.g., including processing circuitry and/or program elements) 240, and a second buffer 250. According to an embodiment, the arithmetic decoder 200 may include various processing circuitry and be implemented with a SoC including at least one processor and a memory (e.g., the first buffer 210 and the second buffer 250). The elements of the arithmetic decoder 200 illustrated in FIG. 4 may be a separate hardware module or may be a software module implemented by at least one processor. For example, the function of each of the modules included in the arithmetic decoder 200 may be performed by one processor or may be performed by each separate processor. The first buffer 210 and the second buffer 250 are illustrated in FIG. 4 as being included in the arithmetic decoder 200. However, the first buffer 210 and the second buffer 250 may be an external memory that is disposed outside the arithmetic decoder 200 and is electrically connected with the arithmetic decoder 200.

According to an embodiment, the first buffer 210 may store a bit stream. The bit stream may be the encoding result of the bin string and may include a regular coding block including at least one encoded regular bin and a bypass coding block including at least one encoded bypass bin.

According to an embodiment, the bit stream stored in the first buffer 210 may be input to the first decoder 220, the second decoder 230, and the parameter calculating module 240. For example, the regular coding block included in the bit stream may be input to the first decoder 220, and the bypass coding block included in the bit stream may be input to the second decoder 230 and the parameter calculating module 240.

According to an embodiment, the first decoder 220 may decode the regular coding block received from the first buffer 210. According to an embodiment, the first decoder 220 may perform regular decoding on the regular coding block. For example, the regular decoding may be adaptive binary arithmetic decoding, which performs decoding depending on the probabilities of occurrence of symbols (e.g., '0' and '1') included in the encoded regular bin, using context information. The context information may be information about the probabilities of occurrence of symbols, and may include, for example, syntax information of a bin, bin index information that is a location of a bin in the bit stream, probability information of a bin included in a block adjacent to a block including a bin, or the like. According to an embodiment, if the regular decoding is started, the first decoder 220 may perform context modeling for estimating probability information of the bin using the context information. According to an embodiment, the first decoder 220 may perform regular decoding on the input bin using the probability information of the bin. According to an embodiment, the first decoder 220 may continuously update context information in the decoding process of the regular bin block.

According to an embodiment, after decoding the regular coding block, the first decoder 220 may store the regular bin block, which is the decoding result of the regular coding block, in the second buffer 250. For example, the regular bin block may include at least one decoded regular bin. According to an embodiment, if decoding of the regular coding block is completed, the first decoder 220 may transmit storage ending location information of the regular bin block (or storage starting location information of the bypass bin block) to the second decoder 230. For example, if the decoding of a first regular coding block is completed, the first decoder 220 may transmit storage ending location information of a first regular bin block (or storage starting location information of a first bypass bin block) being the decoding result of the first regular coding block to the second decoder 230.

According to an embodiment, the second decoder 230 may decode the bypass coding block received from the first buffer 210. According to an embodiment, the second decoder 230 may perform bypass decoding on the bypass coding block. For example, the bypass decoding may be a simple decoding method that decodes the bypass bin in which the probabilities of occurrence of symbols (e.g., '0' and '1') are the same as each other.

According to an embodiment, after decoding the bypass coding block, the second decoder 230 may store the bypass bin block, which is the decoding result of the bypass coding block, in the second buffer 250. For example, the bypass bin block may include at least one decoded bypass bin. According to an embodiment, the second decoder 230 may store the bypass bin block in the second buffer 250 based on storage ending location information of the regular bin block (or storage starting location information of the bypass bin block) received from the first decoder 220. For example, after setting the storage ending location of the first regular bin block received from the first decoder 220 to the starting location, the second decoder 230 may store the first bypass bin block.

According to an embodiment, the first decoder 220 and the second decoder 230 may be disposed in the arithmetic decoder 200 in parallel. According to an embodiment, the first decoder 220 and the second decoder 230 may decode one regular coding block and one bypass coding block during a specified processing cycle, respectively. For example, the first decoder 220 may decode the first regular coding block during a first processing cycle and may decode a second regular coding block during a second processing cycle. The second decoder 230 may decode the first bypass coding block interposed between the first regular coding block and the second regular coding block during the second processing cycle. That is, the first bypass coding block may be decoded during the next cycle of a cycle in which the first regular coding block is decoded.

According to an embodiment, the first decoder 220 and the second decoder 230 may operate at the same time during at least part of a time period. For example, a time period in which the first decoder 220 decodes the second regular coding block during the second processing cycle may at least partially overlap a time period in which the second decoder 230 decodes the first bypass coding block during the second processing cycle.

According to an embodiment, the parameter calculating module 240 may calculate context information of the bypass coding block using the bypass coding block received from the first buffer 210. Unlike the regular decoding, the bypass decoding does not need a context modeling process. However, symbols included in the bypass bin may affect the context information of symbols included in the regular bin due to the feature of adaptive binary arithmetic coding. Accordingly, as well as the context information of the first regular coding block, the context information of the first bypass coding block may be needed such that the first decoder 220 decodes the second regular coding block.

According to an embodiment, before the bypass coding block is decoded, the parameter calculating module 240 may calculate the parameter of the bypass coding block. For example, the parameter may include the context information of the bypass coding block and the size of the bypass bin block being the decoding result of the bypass coding block. For example, the parameter calculating module 240 may calculate the context information of the first bypass coding block during the first processing cycle that is before the second decoder 230 decodes the first bypass coding block. As another example, the parameter calculating module 240 may calculate the size of the first bypass bin block being the decoding result of the first bypass coding block during the first processing cycle that is before the second decoder 230 decodes the first bypass coding block.

According to an embodiment, if the decoding of the first decoder 220 is completed, the parameter calculating module 240 may calculate the parameter of the bypass coding block. For example, the first decoder 220 may decode a first regular coding block during a first time period of the first processing cycle, and the parameter calculating module 240 may calculate the parameter of a first bypass coding block during a second time period of the first processing cycle. Before the decoding of a regular coding block is completed by the first decoder 220, the parameter calculating module 240 may not recognize the starting location of a bypass coding block included in the bit stream. After the decoding of a regular coding block is completed by the first decoder 220, the parameter calculating module 240 may recognize the starting location of the bypass coding block. If the decoding of the regular coding block is completed, the first decoder 220 may transmit the storage ending location information of the regular coding block of the first buffer 210 (or the storage starting location information of the bypass coding block) to the parameter calculating module 240. After loading the bypass coding block from the storage ending location of the regular coding block of the first buffer 210, the parameter calculating module 240 may calculate the parameter of the bypass coding block.

According to an embodiment, if additional information is inserted into the bypass coding block, the parameter calculating module 240 may calculate the parameter of the bypass coding block using the additional information. For example, the additional information may be inserted into the starting location of the bypass coding block.

According to an embodiment, if the decoding of the regular coding block is completed, the first decoder 220 may transmit the final context information of the regular coding block to the parameter calculating module 240. According to an embodiment, the parameter calculating module 240 may calculate the context information for decoding the next regular coding block using the final context information of the regular coding block received from the first decoder 220 and the context information of the bypass coding block. For example, the parameter calculating module 240 may calculate the start context information of the second regular coding block using the final context information of the first regular coding block received from the first decoder 220 and the context information of the first bypass coding block. According to an embodiment, the parameter calculating module 240 may transmit the start context information of the second regular coding block to the first decoder 220. According to an embodiment, the first decoder 220 may decode the second regular coding block using the start context information of the second regular coding block during the second processing cycle.

According to an embodiment, the parameter calculating module 240 may transmit the context information of the bypass coding block to the first decoder 220. According to an embodiment, the first decoder 220 may calculate context information for decoding the regular coding block using the context information of the bypass coding block received from the parameter calculating module 240. For example, the first decoder 220 may calculate the start context information of the second regular coding block using the final context information of the first regular coding block and the context information of the first bypass coding block received from the parameter calculating module 240. According to an embodiment, the first decoder 220 may decode the second regular coding block using the start context information of the second regular coding block during the second processing cycle.

According to an embodiment, if the decoding of the regular coding block is completed, the first decoder 220 may transmit storage ending location information of the regular bin block to the parameter calculating module 240. According to an embodiment, the parameter calculating module 240 may calculate storage ending location information of the bypass bin block (or storage starting location information of the next regular bin block) using the storage ending location information of the regular bin block received from the first decoder 220 and size information of the bypass bin block. For example, the parameter calculating module 240 may calculate the storage ending location information of the first bypass bin block (or the storage starting location information of the second regular bin block) using the storage ending location information of the first regular bin block received from the first decoder 220 and the size information of the first bypass bin block. According to an embodiment, the parameter calculating module 240 may transmit the storage ending location information of the first bypass bin block to the first decoder 220. According to an embodiment, the first decoder 220 may store the second regular bin block being the decoding result of the second regular coding block in the second buffer 250 based on the storage ending location information of the first bypass bin block during the second processing cycle. For example, after setting the storage ending location of the first bypass bin block to the starting location, the first decoder 220 may store the second regular bin block.

According to an embodiment, the parameter calculating module 240 may transmit the size information of the first bypass bin block to the first decoder 220. According to an embodiment, the first decoder 220 may calculate the storage ending location information of the bypass bin block (or the storage starting location information of the next regular bin block) using the size information of the bypass bin block received from the parameter calculating module 240. For example, the first decoder 220 may calculate the storage ending location information of the first bypass bin block (or the storage starting location information of the second regular bin block) using the storage ending location information of the first regular bin block and the size information of the first bypass bin block received from the parameter calculating module 240. According to an embodiment, the first decoder 220 may store the second regular bin block being the decoding result of the second regular coding block in the second buffer 250 based on the storage ending location information of the first bypass bin block during the second processing cycle. For example, after setting the storage ending location of the first bypass bin block to the starting location, the first decoder 220 may store the second regular bin block.

According to an embodiment, the second buffer 250 may store a bin string being the decoding result of the bit stream. According to an embodiment, the bit stream may include a regular bin block including at least one regular bin and a bypass bin block including at least one bypass bin. According to an embodiment, the regular bin block and the bypass bin block included in the bin string may be disposed in the order corresponding to the regular coding block and the bypass coding block included in the bit stream. For example, if the bit stream disposed in the order of the first regular coding block, the first bypass coding block, the second regular coding block, and the second bypass coding block is input to the arithmetic decoder 200, the bin string disposed in the order of the first regular bin block, the first bypass bin block, the second regular bin block, and the second bypass bin block may be output.

Figure 5:
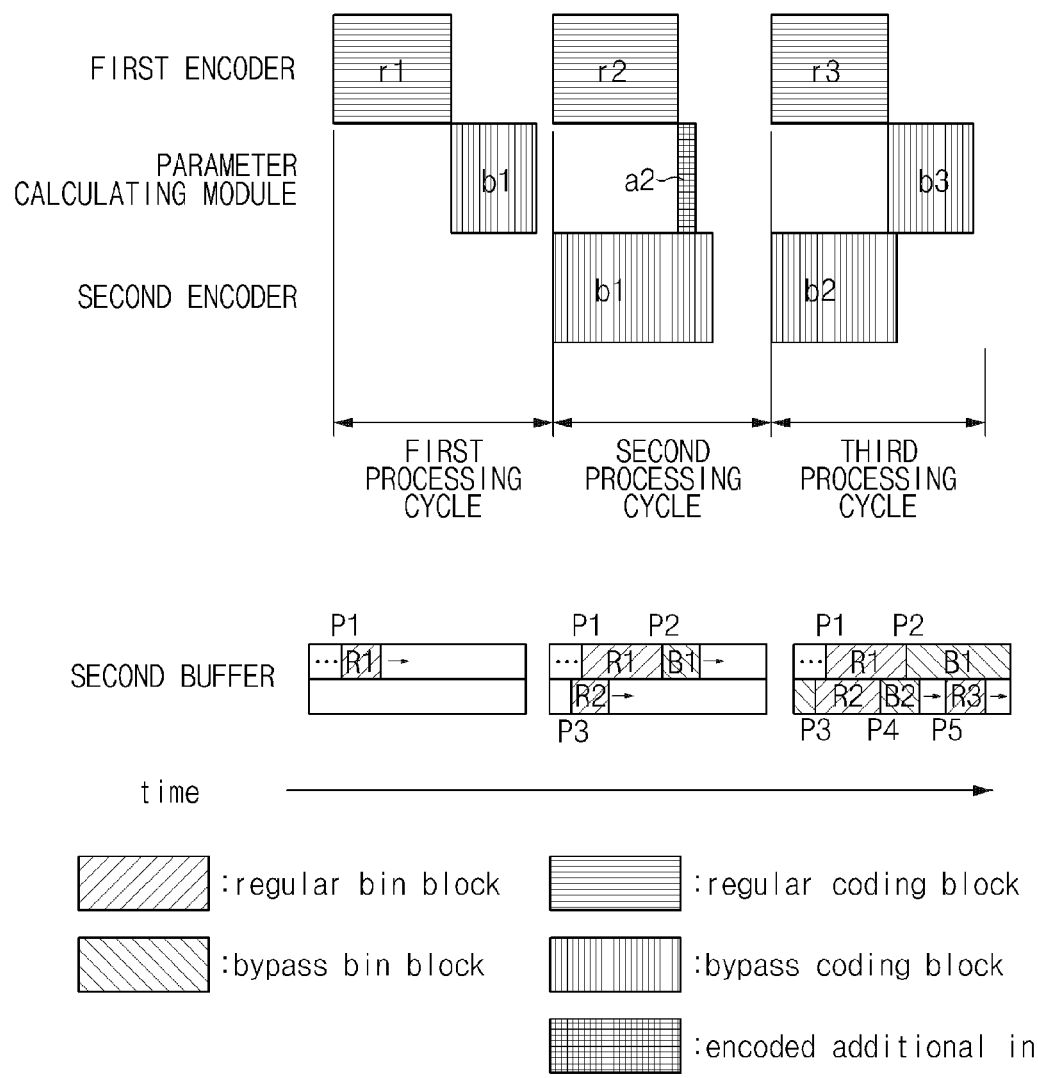
FIG. 5 is a diagram illustrating an example decoding process as time goes on, according to various example embodiments of the present disclosure.

FIG. 5 is a diagram illustrating an example decoding process as time goes on, according to various example embodiments of the present disclosure.

According to an embodiment, the first decoder 220 may decode a first regular coding block r1 during a first processing cycle. For example, the first decoder 220 may decode the first regular coding block r1 using start context information of the first regular coding block r1. According to an embodiment, the first decoder 220 may store a first regular bin block R1 being the decoding result of the first regular coding block r1 in the second buffer 250. For example, the first decoder 220 may store the first regular bin block R1 from a first location P1 of the second buffer 250.

According to an embodiment, the parameter calculating module 240 may calculate a parameter of a first bypass coding block b1 during the first processing cycle. For example, the parameter calculating module 240 may calculate the context information of the first bypass coding block b1. As another example, the parameter calculating module 240 may calculate the size of a first bypass bin block B1 being the decoding result of the first bypass coding block b1.

According to an embodiment, the first decoder 220 or the parameter calculating module 240 may calculate start context information of a second regular coding block r2 using the final context information of the first regular coding block r1 and the context information of the first bypass coding block b1 during the first processing cycle. According to an embodiment, the first decoder 220 or the parameter calculating module 240 may calculate a third location P3 being a storage starting location of a second regular bin block R2 using a storage ending location P2 of the first regular bin block R1 and the size information of the first bypass bin block B1 during the first processing cycle.

According to an embodiment, the first decoder 220 may decode the second regular coding block r2 during a second processing cycle. For example, the first decoder 220 may decode the second regular coding block r2 using the start context information of the second regular coding block r2. According to an embodiment, the first decoder 220 may store the second regular bin block R2 being the decoding result of the second regular coding block r2 in the second buffer 250. For example, the first decoder 220 may store the second regular bin block R2 from the third location P3 of the second buffer 250.

According to an embodiment, the parameter calculating module 240 may calculate a parameter of a second bypass coding block b2 during the second processing cycle. For example, the second bypass coding block b2 may include additional information a2. The parameter calculating module 240 may calculate the parameter of the second bypass coding block b2 using the additional information a2 included in the second bypass coding block b2. For example, the parameter calculating module 240 may calculate the context information of the second bypass coding block b2 using the additional information a2. As another example, the parameter calculating module 240 may calculate the size of a second bypass bin block B2 using the additional information a2.

According to an embodiment, the first decoder 220 or the parameter calculating module 240 may calculate start context information of a third regular coding block r3 using the final context information of the second regular coding block r2 and the context information of the second bypass coding block b2 during the second processing cycle. According to an embodiment, the first decoder 220 or the parameter calculating module 240 may calculate a fifth location P5 being a storage starting location of a third regular bin block R3 using a storage ending location P4 of the second regular bin block R2 and the size information of the second bypass bin block B2 during the second processing cycle.

According to an embodiment, the second decoder 230 may decode the first bypass coding block b1 during the second processing cycle. According to an embodiment, the second decoder 230 may store the first bypass bin block B1 being the decoding result of the first bypass coding block b1 in the second buffer 250. For example, the second decoder 230 may store the first bypass bin block B1 from the second location P2 of the second buffer 250 being the storage ending location of the first regular bin block R1.

According to an embodiment, the first decoder 220 may decode the third regular coding block r3 during a third processing cycle. For example, the first decoder 220 may decode the third regular coding block r3 using start context information of the third regular coding block r3. According to an embodiment, the first decoder 220 may store the third regular bin block R3 being the decoding result of the third regular coding block r3 in the second buffer 250. For example, the first decoder 220 may store the third regular bin block R3 from the fifth location P5 of the second buffer 250.

According to an embodiment, the parameter calculating module 240 may calculate a parameter of a third bypass coding block b3 during the third processing cycle. For example, the parameter calculating module 240 may calculate the context information of the third bypass coding block b3. As another example, the parameter calculating module 240 may calculate the size of a third bypass bin block B3 being the decoding result of the third bypass coding block b3.

According to an embodiment, the first decoder 220 or the parameter calculating module 240 may calculate start context information of a fourth regular coding block (not illustrated) using the final context information of the third regular coding block r3 and the context information of the third bypass coding block b3 during the third processing cycle. According to an embodiment, the first decoder 220 or the parameter calculating module 240 may calculate the storage starting location (not illustrated) of a fourth regular bin block (not illustrated) using the storage ending location (not illustrated) of the third regular bin block R3 and the size information of the third bypass bin block B3 during the third processing cycle.

According to an embodiment, the second decoder 230 may decode the second bypass coding block b2 during the third processing cycle. For example, the second bypass coding block b2 may include additional information a2. According to an embodiment, the second decoder 230 may decode the second bypass coding block b2 other than the additional information a2. According to an embodiment, the second decoder 230 may store the second bypass bin block B2 being the decoding result of the second bypass coding block b2 in the second buffer 250. For example, the second decoder 230 may store the second bypass bin block B2 from the fourth location P4 of the second buffer 250 being the storage ending location of the second regular bin block R2.

According to various embodiments of the present disclosure, the parameter of the bypass coding block may be calculated before the bypass coding block is decoded, and thus the decoding of the regular coding block and the bypass coding block may be simultaneously processed in parallel. As such, even a block in which there is a lot of bins may be processed within a specified processing cycle, and the bottleneck in an entropy coding step may be reduced.

Figure 6:
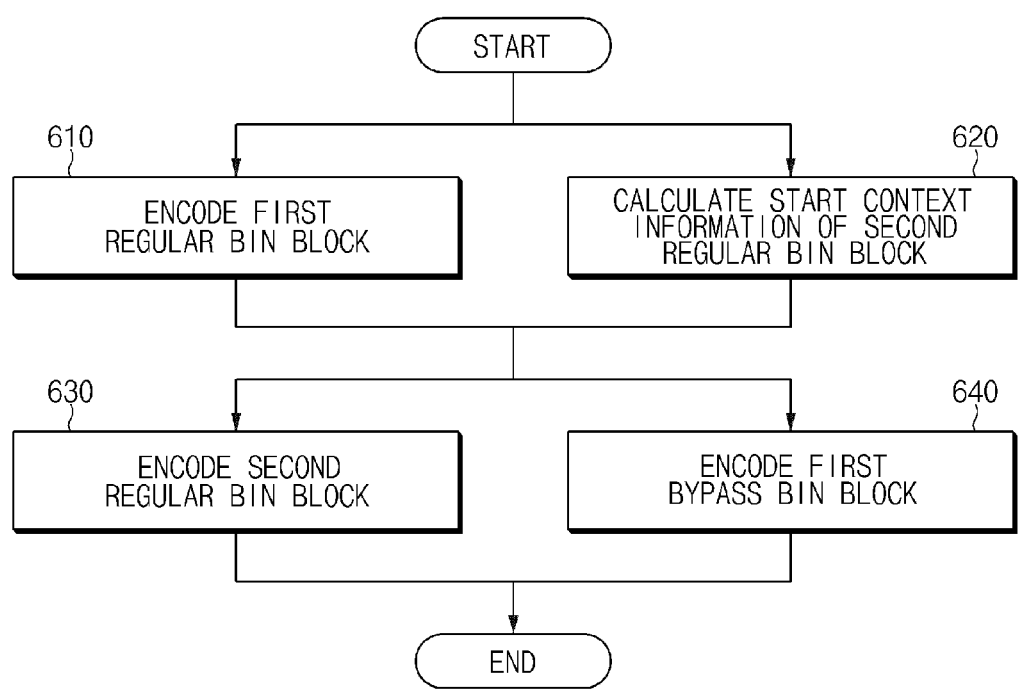
FIG. 6 is a flowchart illustrating an example encoding method of an arithmetic encoder, according to various example embodiments of the present disclosure.

FIG. 6 is a flowchart illustrating an example encoding method of an arithmetic encoder, according to various example embodiments of the present disclosure.

The flowchart illustrated in FIG. 6 may include operations that the above-described arithmetic encoder 100 processes. Even though not fully repeated below, details about the arithmetic encoder 100 described with reference to FIGS. 1 to 3 may be applied to the flowchart illustrated in FIG. 6.

According to an embodiment, in operation 610, the arithmetic encoder 100 may encode a first regular bin block including at least one regular bin during a first processing cycle. For example, the arithmetic encoder 100 may perform regular encoding, which performs encoding depending on the probabilities of occurrence of symbols (e.g., '0' and '1') included in the regular bin, on the first regular bin block using context information. According to an embodiment, the arithmetic encoder 100 may continuously update context information in an encoding process of the first regular bin block.

According to an embodiment, after encoding the first regular bin block, the arithmetic encoder 100 may store the first regular coding block, which is the encoding result of the first regular bin block, in a buffer (e.g., the second buffer 150).

According to an embodiment, in operation 620, the arithmetic encoder 100 may calculate start context information of a second regular bin block including at least one regular bin during the first processing cycle. For example, the arithmetic encoder 100 may calculate context information of a first bypass bin block during the first processing cycle. The arithmetic encoder 100 may calculate the start context information of the second regular bin block using final context information of the first regular bin block and the context information of the first bypass bin block.

According to an embodiment, the arithmetic encoder 100 may calculate the size of the first bypass coding block being the encoding result of the first bypass bin block during the first processing cycle. According to an embodiment, the arithmetic encoder 100 may calculate storage ending location information of the first bypass coding block (or storage starting location information of the second regular coding block) using storage ending location information of the first regular coding block and size information of the first bypass coding block.

According to an embodiment, in operation 630, the arithmetic encoder 100 may encode the second regular bin block using the start context information of the second regular bin block during a second processing cycle.

According to an embodiment, after encoding the second regular bin block, the arithmetic encoder 100 may store the second regular coding block, which is the encoding result of the second regular bin block, in a buffer (e.g., the second buffer 150). For example, after setting the storage ending location of the first bypass coding block to the starting location, the arithmetic encoder 100 may store the second regular coding block.

According to an embodiment, in operation 640, the arithmetic encoder 100 may encode the first bypass bin block including at least one bypass bin during the second processing cycle. For example, the arithmetic encoder 100 may perform bypass encoding on a bypass bin in which the probabilities of occurrence of symbols (e.g., '0' and '1') are the same as each other. For example, the bypass bin block may be interposed between the first regular bin block and the second regular bin block.

According to an embodiment, after encoding the first bypass bin block, the arithmetic encoder 100 may store the first bypass coding block, which is the encoding result of the first bypass bin block, in a buffer (e.g., the second buffer 150). For example, after setting the storage ending location of the first regular coding block to the starting location, the arithmetic encoder 100 may store the first bypass coding block.

According to an embodiment, operation 630 and operation 640 may operate at the same time during at least part of time period in the second processing cycle. That is, the arithmetic encoder 100 may encode a regular bin block and a bypass bin block in parallel during the second processing cycle.

According to an embodiment, before encoding the first bypass bin block, the arithmetic encoder 100 may insert additional information for calculating the parameter of a decoder (e.g., the arithmetic decoder 200 of FIG. 4) into the first bypass bin block. For example, the additional information may include the size information of the first bypass coding block and at least one information about the number of symbols included in the first bypass coding block. According to an embodiment, the arithmetic encoder 100 may determine whether the additional information is inserted, based on the number of regular bins included in the first regular bin block and the number of bypass bins included in the first bypass bin block.

Figure 7:
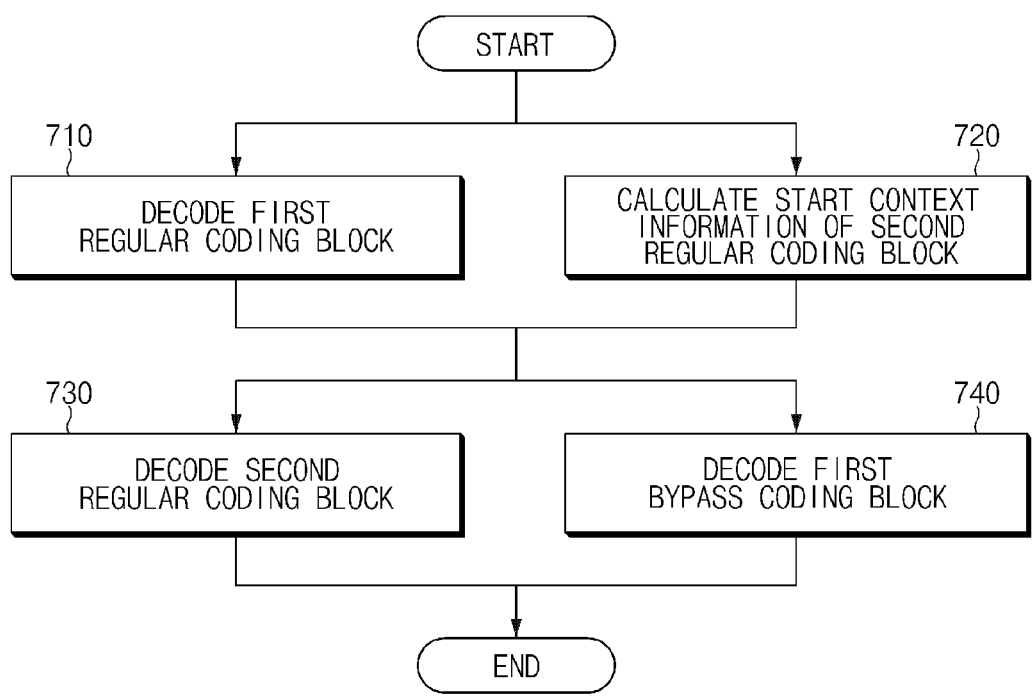
FIG. 7 is a flowchart illustrating an example decoding method of an arithmetic decoder, according to various example embodiments of the present disclosure.

FIG. 7 is a flowchart illustrating an example decoding method of an arithmetic decoder, according to various example embodiments of the present disclosure.

The flowchart illustrated in FIG. 7 may include operations that the above-described arithmetic decoder 200 processes. Even though not fully repeated below, details about the arithmetic decoder 200 described with reference to FIGS. 4 to 5 may be applied to the flowchart illustrated in FIG. 7.

According to an embodiment, in operation 710, the arithmetic decoder 200 may decode a first regular coding block including at least one encoded regular bin during a first processing cycle. For example, the arithmetic decoder 200 may perform regular decoding, which performs decoding depending on the probabilities of occurrence of symbols (e.g., '0' and '1') included in the encoded regular bin, using context information, on the first regular coding block. According to an embodiment, the arithmetic decoder 200 may continuously update context information in a decoding process of the first regular coding block.

According to an embodiment, after decoding the first regular coding block, the arithmetic decoder 200 may store a first regular bin block being the decoding result of the first regular coding block in a buffer (e.g., the second buffer 250).

According to an embodiment, in operation 720, the arithmetic decoder 200 may calculate start context information of a second regular coding block including at least one encoded regular bin during the first processing cycle. For example, the arithmetic decoder 200 may calculate context information of a first bypass coding block during the first processing cycle. The arithmetic decoder 200 may calculate the start context information of the second regular coding block using final context information of the first regular coding block and the context information of the first bypass coding block. According to an embodiment, if additional information is inserted into the first bypass coding block, the arithmetic decoder 200 may calculate the context information of the first bypass coding block using the additional information.

According to an embodiment, the arithmetic decoder 200 may calculate the size of a first bypass bin block being the decoding result of the first bypass coding block during the first processing cycle. According to an embodiment, the arithmetic decoder 200 may calculate storage ending location information of the first bypass bin block (or storage starting location information of a second regular bin block) using storage ending location information of the first regular bin block and size information of the first bypass bin block. According to an embodiment, if the additional information is inserted into the first bypass coding block, the arithmetic decoder 200 may calculate the size of the first bypass bin block using the additional information.

According to an embodiment, in operation 730, the arithmetic decoder 200 may decode the second regular coding block using the start context information of the second regular coding block during a second processing cycle.

According to an embodiment, after decoding the second regular coding block, the arithmetic decoder 200 may store the second regular bin block being the decoding result of the second regular coding block in a buffer (e.g., the second buffer 250). For example, after setting the storage ending location of the first bypass bin block to the starting location, the arithmetic decoder 200 may store the second regular bin block.

According to an embodiment, in operation 740, the arithmetic decoder 200 may decode the first bypass coding block including at least one encoded bypass bin during the second processing cycle. For example, the arithmetic decoder 200 may perform bypass decoding on the encoded bypass bin in which the probabilities of occurrence of symbols (e.g., '0' and I') are the same as each other. For example, the bypass coding block may be interposed between the first regular coding block and the second regular coding block.

According to an embodiment, after decoding the first bypass coding block, the arithmetic decoder 200 may store the first bypass bin block being the decoding result of the first bypass coding block in a buffer (e.g., the second buffer 250). For example, after setting the storage ending location of the first regular bin block to the starting location, the arithmetic decoder 200 may store the first bypass bin block.

According to an embodiment, operation 730 and operation 740 may operate at the same time during at least part of time period in the second processing cycle. That is, the arithmetic decoder 200 may decode a regular coding block and a bypass coding block in parallel during the second processing cycle.

Figure 8:
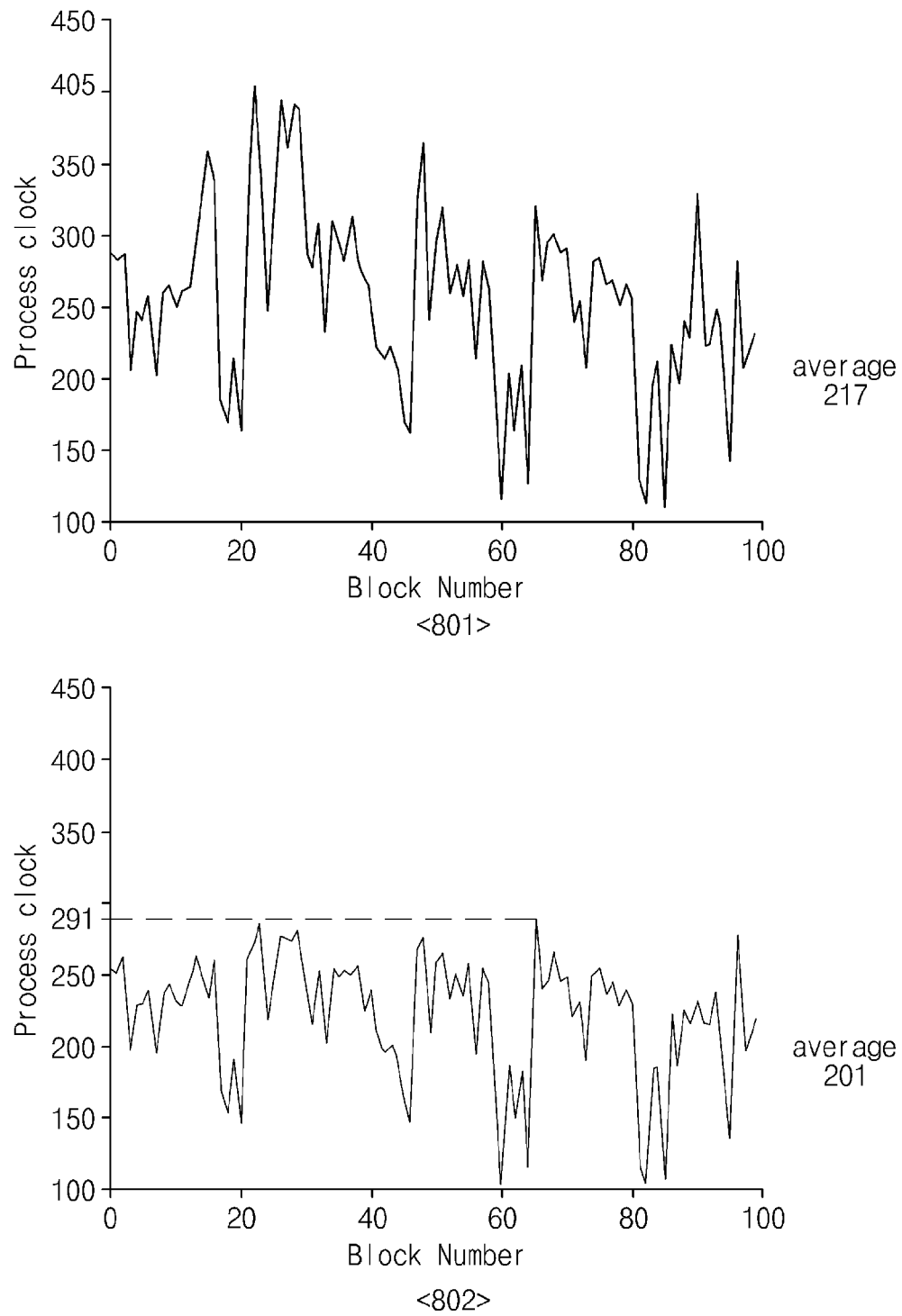
FIG. 8 is a diagram illustrating an example decoding performance improving effect of an arithmetic decoder, according to various example embodiments of the present disclosure.

FIG. 8 is a diagram illustrating an example of decoding performance improving effect of an arithmetic decoder, according to various example embodiments of the present disclosure.

An image 801 of FIG. 8 is a graph illustrating the decoding performance of an arithmetic decoder to which the present disclosure is not applied. An image 802 of FIG. 8 is a graph illustrating the decoding performance of the arithmetic decoder according to an embodiment of the present disclosure. The x-axis of each of the image 801 and the image 802 of FIG. 8 is the number of large blocks. The y-axis of each of the image 801 and the image 802 of FIG. 8 is the number of clocks required to process each block.

If the image 801 is compared with the image 802, an average of the number of clocks required to process one block is from 201 clocks to 217 clocks. Accordingly, the performance may be improved by about 7.3%. The number of clocks required to process a block of which the number of processing clocks is the highest may be from 405 clocks to 291 clocks. Accordingly, the performance may be improved by about 28%.

The term "module" used herein may include a unit, which is implemented with hardware, software, or firmware, and may be interchangeably used with the terms "logic", "logical block", "component", "circuit", or the like. The "module" may be a minimum unit of an integrated component or a part thereof or may be a minimum unit for performing one or more functions or a part thereof. The "module" may be implemented mechanically or electronically and may include, for example, and without limitation, a dedicated processor, a CPU, an application-specific IC (ASIC) chip, a field-programmable gate array (FPGA), and a programmable-logic device for performing some operations, which are known or will be developed.

According to various embodiments, at least a part of an apparatus (e.g., modules or functions thereof) or a method (e.g., operations) may be, for example, implemented by instructions stored in a computer-readable storage media in the form of a program module. The instruction, when executed by a processor, may cause the processor to perform a function corresponding to the instruction. The computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, and the like. The instruction may include codes created by a compiler or codes that are capable of being executed by a computer using an interpreter. According to various embodiments, a module or a program module may include at least one of the above elements, or a part of the above elements may be omitted, or other elements may be further included.

According to various embodiments, operations executed by modules, program modules, or other elements may be executed by a successive method, a parallel method, a repeated method, or a heuristic method, or at least one part of operations may be executed in different sequences or omitted. Alternatively, other operations may be added. While the present disclosure has been shown and described with reference to various embodiments thereof, it will be understood by those skilled in the art that various changes in form and details may be made therein without departing from the spirit and scope of the present disclosure as defined by the appended claims and their equivalents.

According to various embodiments of the present disclosure, the regular bin and the bypass bin may be simultaneously encoded and decoded in parallel and the bottleneck occurring in the entropy coding step may be reduced.

While the present disclosure has been illustrated and described with reference to various example embodiments thereof, it will be understood by those skilled in the art that various changes in form and details may be made therein without departing from the spirit and scope of the present disclosure as defined by the appended claims and their equivalents.

What is claimed is:

1. A processor comprising:
   a first encoder configured to encode a regular bin block including at least one regular bin;
   a second encoder configured to encode a bypass bin block including at least one bypass bin; and
   a parameter calculating module comprising parameter calculating circuitry configured to determine context information for encoding the regular bin block and to transmit the context information to the first encoder,
   wherein the first encoder and the second encoder are configured to process the regular bin block and the bypass bin block simultaneously and in parallel during at least part of a specific processing cycle,
   wherein the first encoder is configured to encode a first regular bin block during a first processing cycle and to encode a second regular bin block during a second processing cycle, and
   wherein the second encoder is configured to encode a first bypass bin block interposed between the first regular bin block and the second regular bin block during the second processing cycle.

2. The processor of claim 1, wherein the first encoder is configured to determine final context information of the first regular bin block during the first processing cycle and to transmit the final context information of the first regular bin block to the parameter calculating module, and
   wherein during the first processing cycle, the parameter calculating module is configured to determine context information of the first bypass bin block, to determine start context information of the second regular bin block by using the final context information of the first regular bin block and the context information of the first bypass bin block, and to transmit the start context information of the second regular bin block to the first encoder.

3. The processor of claim 2, wherein the first encoder is configured to encode the second regular bin block using the start context information of the second regular bin block during the second processing cycle.

4. The processor of claim 1, further comprising:
   a buffer,
   wherein during the first processing cycle, the first encoder is configured to store the encoding result of the first regular bin block as the first regular coding block in the buffer and to transmit storage ending location information of the first regular coding block to the second encoder, and
   wherein the second encoder is configured to store the encoding result of the first bypass bin block as a first bypass coding block in the buffer based on the storage ending location information during the second processing cycle.

5. The processor of claim 1, further comprising:
   a buffer,
   wherein during the first processing cycle, the parameter calculating module is configured to store storage ending location information of a first bypass coding block comprising the encoding result of the first bypass bin block and to transmit the storage ending location information to the first encoder, and
   wherein the first encoder is configured to store the encoding result of the second regular bin block as a second regular coding block in the buffer based on the storage ending location information during the second processing cycle.

6. The processor of claim 1, wherein the parameter calculating module is configured to:
   insert size information of a first bypass coding block comprising the encoding result of the first bypass bin block and at least one information about a number of symbols, which is included in the first bypass coding block, into the first bypass coding block.

7. A data processing method of a processor, the method comprising:
   encoding a first regular bin block including at least one first regular bin during a first processing cycle;
   determining start context information of a second regular bin block including at least one second regular bin during the first processing cycle;
   encoding the second regular bin block using the start context information of the second regular bin block during a second processing cycle; and
   encoding a first bypass bin block, which is interposed between the first regular bin block and the second regular bin block and which includes at least one bypass bin, during the second processing cycle.

8. The method of claim 7, wherein the determining of the start context information of the second regular bin block includes:
   determining final context information of the first regular bin block and context information of the first bypass bin block during the first processing cycle; and
   determining the start context information of the second regular bin block using the final context information of the first regular bin block and the context information of the first bypass bin block.

9. The method of claim 7, further comprising:
   storing the encoding result of the first regular bin block as a first regular coding block in a buffer during the first processing cycle; and
   storing the encoding result of the first bypass bin block as a first bypass coding block in the buffer based on storage ending location information of the first regular coding block during the second processing cycle.

10. The method of claim 7, further comprising:
    determining storage ending location information of a first bypass coding block being the encoding result of the first bypass bin block during the first processing cycle; and
    storing the encoding result of the second regular bin block as a second regular coding block in a buffer based on the storage ending location information during the second processing cycle.

11. The method of claim 7, further comprising:
inserting size information of a first bypass coding block comprising the encoding result of the first bypass bin block and at least one information about a number of symbols included in the first bypass coding block into the first bypass coding block.

12. The method of claim 7, further comprising:
decoding a first regular coding block including at least one encoded first regular bin during the first processing cycle;
determining start context information of a second regular coding block including at least one encoded second regular bin during the first processing cycle;
decoding the second regular coding block using the start context information of the second regular coding block during the second processing cycle; and
decoding a first bypass coding block, which is interposed between the first regular coding block and the second regular coding block and which includes at least one encoded bypass bin, during the second processing cycle.

13. The method of claim 12, wherein the determining of the start context information of the second regular coding block includes:
determining final context information of the first regular coding block and context information of the first bypass coding block during the first processing cycle; and
determining the start context information of the second regular coding block using the final context information of the first regular coding block and the context information of the first bypass coding block.

14. The method of claim 13, wherein the determining of the context information of the first bypass coding block further includes:
determining final context information of the first bypass coding block using size information of the first bypass coding block and at least one information about a number of symbols included in the first bypass coding block if the size information of the first bypass coding block and the at least one information about the number of symbols included in the first bypass coding block are included in the first bypass coding block.

15. The method of claim 12, further comprising:
storing the decoding result of the first regular coding block as the first regular bin block in a buffer during the first processing cycle; and
storing the decoding result of the first bypass coding block as a first bypass bin block in the buffer based on storage ending location information of the first regular bin block during the second processing cycle.

16. The method of claim 12, further comprising:
determining storage ending location information of a first bypass bin block being the decoding result of the first bypass coding block during the first processing cycle; and
storing the decoding result of the second regular coding block as a second regular bin block in a buffer based on the storage ending location information during the second processing cycle.

17. A non-transitory computer-readable recording medium having recorded thereon a program which, when executed by a processor, causes the processor to perform operations comprising:
encoding a first regular bin block including at least one first regular bin during a first processing cycle;
determining start context information of a second regular bin block including at least one second regular bin during the first processing cycle;
encoding the second regular bin block using the start context information of the second regular bin block during a second processing cycle; and
encoding a first bypass bin block, which is interposed between the first regular bin block and the second regular bin block and which includes at least one bypass bin, during the second processing cycle.

18. The non-transitory computer-readable recording medium of claim 17, wherein the determining of the start context information of the second regular bin block includes:
determining final context information of the first regular bin block and context information of the first bypass bin block during the first processing cycle; and
determining the start context information of the second regular bin block using the final context information of the first regular bin block and the context information of the first bypass bin block.

19. The non-transitory computer-readable recording medium of claim 17, wherein the operations further comprise:
storing the encoding result of the first regular bin block as a first regular coding block in a buffer during the first processing cycle; and
storing the encoding result of the first bypass bin block as a first bypass coding block in the buffer based on storage ending location information of the first regular coding block during the second processing cycle.

* * * * *